(12) United States Patent
Pamulaparthy et al.

(10) Patent No.: US 12,188,972 B2
(45) Date of Patent: Jan. 7, 2025

(54) SYSTEMS AND METHODS FOR MONITORING AND DIAGNOSING POWER SYSTEM ASSETS

(71) Applicant: GE Infrastructure Technology LLC, Greenville, SC (US)

(72) Inventors: Balakrishna Pamulaparthy, Greenville, SC (US); Shahid Ali, Greenville, SC (US); Sumitha Mohan, Greenville, SC (US); Rajagopal Kommu, Greenville, SC (US); Raju Gurrapu, Greenville, SC (US); Sergio Dominguez Ruiz, Greenville, SC (US)

(73) Assignee: GE Infrastructure Technology LLC, Greenville, SC (US)

( * ) Notice: Subject to any disclaimer, the term of this patent is extended or adjusted under 35 U.S.C. 154(b) by 0 days.

(21) Appl. No.: 18/494,407

(22) Filed: Oct. 25, 2023

(65) Prior Publication Data
US 2024/0061031 A1   Feb. 22, 2024

Related U.S. Application Data

(63) Continuation of application No. 16/951,998, filed on Nov. 18, 2020, now Pat. No. 11,835,568.

(51) Int. Cl.
*G01R 31/00* (2006.01)
*G01R 13/00* (2006.01)
(Continued)

(52) U.S. Cl.
CPC ............. *G01R 31/00* (2013.01); *G01R 13/00* (2013.01); *G01R 31/34* (2013.01);
(Continued)

(58) Field of Classification Search
CPC ........ G01R 31/00; G01R 13/00; G01R 31/34; G01R 21/133; G01R 19/2513;
(Continued)

(56) References Cited

U.S. PATENT DOCUMENTS

| 6,005,759 A | 12/1999 | Hart et al. |
| 6,704,668 B2 | 3/2004 | Bibelhausen et al. |

(Continued)

FOREIGN PATENT DOCUMENTS

| CN | 201327521 Y | 10/2009 |
| CN | 102088209 A | 6/2011 |

(Continued)

OTHER PUBLICATIONS

Extended European Search Report issued in EP Application No. 21209139.1, dated Apr. 22, 2022, 8 pages.

(Continued)

*Primary Examiner* — Daniel R Miller
(74) *Attorney, Agent, or Firm* — Eversheds Sutherland (US) LLP

(57) ABSTRACT

Systems, methods, and computer-readable media are disclosed for monitoring and diagnosing power system assets. An example method may include triggering, by a gateway device and at a first time, a capture of a first waveform from a first intelligent electronic device (IED) associated with a first asset in a power system. The method may also include transmitting, by the gateway device, the capture of the waveform to a remote device. The method may also include extracting fault features from the first waveform corresponding to different failure modes associated with the asset of the power system. The method may also include determining, based on the features extracted from first waveform, that a fault of a first fault mode has occurred in the asset. The method may also include providing an alert that the fault has (Continued)

been identified, wherein the alert initiates or otherwise facilitates a control action in the power system.

17 Claims, 6 Drawing Sheets

(51) Int. Cl.
*G01R 31/34* (2020.01)
*G05B 23/02* (2006.01)
*G06F 1/28* (2006.01)
*G06F 1/30* (2006.01)

(52) U.S. Cl.
CPC ........... *G05B 23/0205* (2013.01); *G06F 1/28* (2013.01); *G06F 1/30* (2013.01)

(58) Field of Classification Search
CPC ..... G05B 23/0205; G05B 19/048; G06F 1/28; G06F 1/30; G06F 9/06
See application file for complete search history.

(56) References Cited

U.S. PATENT DOCUMENTS

| | | | |
|---|---|---|---|
| 10,303,127 B2 | 5/2019 | Mazur et al. | |
| 10,319,128 B2 | 6/2019 | Billi-Duran et al. | |
| 2007/0059986 A1 | 3/2007 | Rockwell | |
| 2009/0187344 A1 | 7/2009 | Brancaccio et al. | |
| 2014/0039833 A1* | 2/2014 | Sharpe, Jr. | G05B 19/4184 702/183 |
| 2015/0372865 A1 | 12/2015 | Schmirler et al. | |
| 2018/0357334 A1 | 12/2018 | Chao et al. | |
| 2020/0274523 A1 | 8/2020 | Halladay et al. | |
| 2020/0393501 A1 | 12/2020 | Menzel et al. | |

FOREIGN PATENT DOCUMENTS

| | | | | |
|---|---|---|---|---|
| CN | 102929224 A | 2/2013 | | |
| CN | 104104069 A | 10/2014 | | |
| CN | 105335816 A | 2/2016 | | |
| CN | 106655088 A | 5/2017 | | |
| CN | 108021108 A | 5/2018 | | |
| CN | 108833267 A | 11/2018 | | |
| EP | 1506460 B1 | 7/2007 | | |
| EP | 3454212 A1 | 3/2019 | | |
| WO | 2012145715 A2 | 10/2012 | | |
| WO | WO-2016196775 A1 * | 12/2016 | ............. | G01R 31/40 |
| WO | 2019106875 A1 | 6/2019 | | |
| WO | 2019130165 A1 | 7/2019 | | |

OTHER PUBLICATIONS

Kumar et al., "Intelligent Metering System in Integrated Power Generation & Distribution system of a Steel Complex," 2008 Joint International Conference on Power System Technology and IEEE Power India Conference, New Delhi, India, 2008, pp. 1-8, doi: 10.1109/ICPST.2008.4745153.

Thomas et al., "Waveform extraction and information exchange for data warehousing in power utilities," 2010 Joint International Conference on Power Electronics, Drives and Energy Systems & 2010 Power India, New Delhi, India, 2010, pp. 1-7, doi: 10.1109/PEDES. 2010.5712384.

* cited by examiner

SYSTEMS AND METHODS FOR MONITORING AND DIAGNOSING POWER SYSTEM ASSETS

CROSS-REFERENCE TO RELATED APPLICATION(S)

This application is a continuation of and claims the benefit of U.S. Non-Provisional application Ser. No. 16/951,998, filed Nov. 18, 2020, the disclosures of which are incorporated herein by reference as if set forth in full.

TECHNICAL FIELD

The present disclosure relates to power systems, and, more particularly to, systems and methods for monitoring and diagnosing power system assets.

BACKGROUND

In order to monitor an asset (for example, a motor) in a power system for potential fault conditions, some conventional systems may require the use of hardware with embedded logic to be connected to the asset full-time time to perform online and offline monitoring of the asset. However, this hardware may add extra cost and complexity to a system as the hardware may embed different types of logic from different manufacturers. Some systems may use protection relays with such embedded monitoring logic, however, such relays are not as prevalent and features associated with the relays may vary by manufacturer.

BRIEF DESCRIPTION OF THE DRAWINGS

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. In the drawings, the left-most digit(s) of a reference numeral may identify the drawing in which the reference numeral first appears. The use of the same reference numerals indicates similar, but not necessarily the same or identical components. However, different reference numerals may be used to identify similar components as well. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

Figure 1:
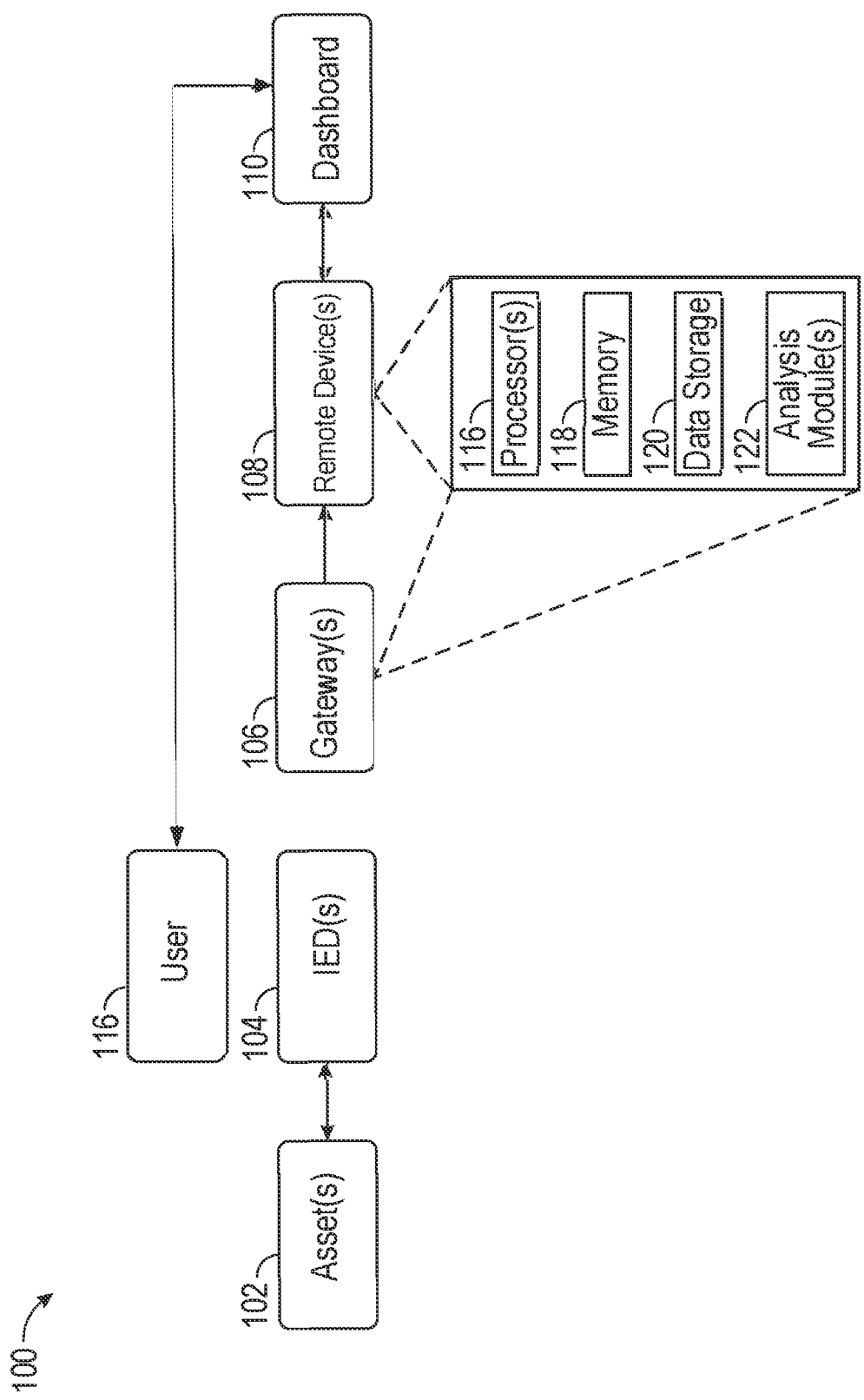
FIG. 1 depicts a schematic illustration of an example system, in accordance with one or more example embodiments of the disclosure.

This disclosure may relate to, among other things, systems and methods for monitoring and diagnosing power system assets. More particularly, in some embodiments, the disclosure may relate to the monitoring and diagnosis of power system assets by capturing operational data from the power system assets using one or more IEDs associated with the assets, and providing the operational data to a remote device (for example, a remote server) for analysis. For example, a waveform, such as a COMTRADE file, that may include voltage and/or current signal waveforms may be captured. An asset may refer to any component within a power system, such as a motor, a generator, a pump, a turbine, a power generation component, a compressor, an engine, a gearbox, or any component or machine in a power plant. An IED may be hardware with embedded logic that may be used to capture and process data associated with an asset. For example, an IED may be a relay. In some instances, an individual asset in the power system may be associated with an individual IED. However, in some instances, multiple assets may share a single IED or a multiple IEDs may share a single asset as well. In some instances, a gateway device may serve as an intermediary or a data concentrator between the IEDs and the remote device. The gateway device may trigger the IEDs to produce data pertaining to the power system assets at various times and may provide the data to the remote device for analysis. In some instances, the gateway device itself may also perform some data processing, such as data quality checks and other analyses of the data (for example some of the analyses described herein as being performed at the remote device). However, in some instances, all of the data analysis may be performed at the remote device, and the gateway device may simply serve to compile data from the IEDs and provide the data to the remote device. The analytics performed by the remote device may be used to establish tunable and self-learning fault index baselines that may be used to detect faults of varying types of fault modes in various assets in the power system. A user may then be alerted that such a fault has occurred or may occur in a particular asset of the power system.

In some embodiments, once the gateway device triggers an IED to provide data to the gateway device, the gateway device may perform one or more data quality checks on the data produced by the IED. The level of data quality check performed by the gateway device may depend on the processing capabilities of the gateway device. For example, in some instances, the gateway device may perform a basic data quality check on the data. A basic data quality check may include an analysis of low frequency data directly available from the IED, such as an analysis to determine if the data is within one or more predefined thresholds. In some cases, this basic quality data check analysis may involve root mean square (RMS) voltage, RMS current, and/or frequency data being compared to the one or more thresholds. These values may be internally calculated by the IEDs from the high frequency voltages and currents. Thus, high frequency voltage and current waveforms may not need to be processed to extract this data, which may reduce computational load on the gateway device. If this basic quality check is successful (for example, if the gateway device determines that the data does not fail the data quality check), then the data may then be provided by the gateway device to the remote device. Otherwise, the gateway device may not provide the data to the remote device (and trigger the IED to acquire a subsequent waveform). In some cases, the gateway may instead perform a more detailed data quality check on the data. A more detailed data quality check may include an analysis of high frequency data. High frequency data may be, for example, the instantaneous voltage and current values (as well as other values, such as vibration, temperature, etc. in some cases) sampled at a higher frequency (for example, 12, 16, 24, 32, 64, or 128 samples per fundamental cycle of voltage or current waveform, as well as any other sampling frequencies). An example sampling frequency may range from 1 Khz to 10 Khz in some scenarios, but does not have to be limited to this range. The detailed data quality check may involve a phase-locked loop (PLL) and envelope extraction of voltage and current signals to determine transient stability of the data. If the more detailed data quality check is successful, then the gateway device may send the data to the remote device. Otherwise, the gateway device may not send the data to the remote device (and trigger the IED to acquire a subsequent waveform). In some cases, the gateway may also analyze the high frequency data and perform additional operations with the data that may otherwise be performed at the remote device, such as extracting features from the data that may correspond to different failure modes (for example, eccentricity, broken rotor bar, or bearing fault failure modes, as well as any other types of power system asset failure modes) of the power system assets. In some instances, extracting features may refer to processing the high frequency voltage, current, vibration and/or temperature waveforms using FFTs, sequence components, and other advanced algorithms that may be used derive a fault index (e.g., numbers) which may be indicative of onset of different failure modes.

In some cases, the gateway device may not perform any data quality checks, but may rather simply provide the data from the LEDs to the remote device for analysis and/or the remote device itself may perform quality checks on the data. The remote device may also be configured to perform any of the data quality checks described above as being performed by the gateway device as well. Aspects of performing data filtering and fault feature extraction may include the following. If all of the data is sent for processing without performing a data quality check, then the remote device may determine that the data cannot be used for fault extraction and may reject the data. However, by that time the remote device is able to make this determination, network bandwidth and processing resources at the remote device has already been wasted. By performing some or all of the data quality check at gateway device instead such useless data is prevented from flowing to the remote device, which helps to reduce network loading and storage charges. Also, by performing the additional operation on the high frequency data at gateway large data (high frequency waveform) may be prevented from being sent to the remote device, and send only the extracted fault features (for example, a smaller amount of data), which are eventually calculated in the remote device otherwise and used for asset monitoring.

In some embodiments, the gateway device may also be configured to identify the capability of different LEDs in a power system to provide accurate data to be used for fault detections for different types of fault modes associated with one or more assets of the power system. For example, the gateway device may determine operational parameters of individual LEDs, such as a data sampling frequency, data length, among other information associated with individual LEDs. Some or all of the operational parameters may be determined based on name plate details. Name plate details may refer to motor name plate details, such as rated operating conditions of the motor). Based on the determined operational parameters of an individual IED, the gateway device may block the IED from providing data pertaining to a particular failure mode for which its operational parameters are determined to be insufficient. For example, analysis of data to monitor for a first failure mode of an asset may require a first data sampling frequency and a first data length, but a first IED may not be capable of providing data at the first data sampling frequency. However, a second failure mode of the asset may only require a lower data sampling frequency that the IED is capable of producing. In this particular example, the gateway device may block the IED from providing data pertaining to the first failure mode because the IED may be incapable of providing data at the appropriate data sampling frequency, but may allow the IED to provide data pertaining to the second failure mode. This may serve to reduce the amount of extraneous data that is being provided to the remote device because the data relating to the first failure mode from the IED may be too inaccurate for the remote device to effectively monitor for the first failure mode. However, in some instances, instead of simply blocking an IED from providing data, the gateway device may also adjust the data sampling frequency and data length associated with a given failure mode to levels at which the IED is capable of operating. In such cases, the gateway device may compromise between data length and sampling frequency when IED memory is limited. As an example, a first failure mode (e.g., broken bar failure mode) may need data at a reduced sampling frequency for a higher data length, but a second failure mode (e.g., bearing fault detection) may need data at higher sampling frequency for lower data length. In this scenario, it may not be possible to perform sufficient data capture for detection of the first failure mode, but a compromise may be established to allow data capture to be performed for detection of the second failure mode. To accomplish this, the gateway may be configured to trigger the IED at a reduced sampling frequency, but for a higher data length with the same memory. For example, say the memory is limited to about 4000 points, if data is sampled at about 2 kHz the data length can be about two seconds, which may be sufficient for bearing fault detection but not for broken bar fault detection. In that case, the sampling rate may be adjusted to about 1 kHz and with same memory and about a four second data length may be obtained where about 1 kHz with about four seconds may be sufficient for broken bar fault detection. In some instances, the gateway device, instead of requesting data from the IED at a lower data sampling frequency or data length, may also request the data from a separate IED as a backup to the IED that is determined to have insufficient operational parameters. The separate IED may be an IED with operational parameters that are sufficient for the first failure mode of the asset.

In some embodiments, the gateway device may be configured to trigger data requests from particular LEDs in a controlled manner. The gateway device may ensure that data from different LEDs in a power system may be collected in a time-referenced manner based on a trigger time so that the data may be collected under similar power supply conditions. This may ensure that the data may represent the data from the LEDs that is intended to be obtained by the gateway device. This may be beneficial because the IED may generate data (for example, COMTRADE-type waveform files) randomly due to other events that may take place in between gateway device trigger times. By using controlled trigger times, it may be determined which waveform files from the LEDs to use such that the data from all of the LEDs can be correlated. The trigger timing may also be adaptive in some cases. For example, an initial data trigger may be performed after the end of a baseline period and may vary depending on a specific cluster of LEDs (the baselining and clustering may be described below). The trigger timing may also depend on a baseline health assessment of a given cluster in order to optimize file processing and data storage. Generally, the frequency of the data capture triggers sent by the gateway device to the LEDs may be higher for initial baselining purposes, and after a fault index baseline is established for a given asset or cluster of assets, the frequency may be reduced. Once it is determined that a potential fault may exist in an asset or cluster of assets, the triggering frequency may again be increased. As another example, if the assets are turned off or an IED is in a service and/or test mode, then there may be no trigger by the gateway device until the asset is turned back on or the IED is back to a normal operating condition. As another example, if the assets are turned on and a data quality check that is performed is failed, then another trigger may be performed automatically within a relative short period of time. As a third example, if several data quality checks are failed, triggering may be stopped and only resume after a next interval of time. For example, if the first triggers were performed with a gap of a few minutes many of them resulted in failures, then the duration of time between triggers may be increased.

Figure 4A:
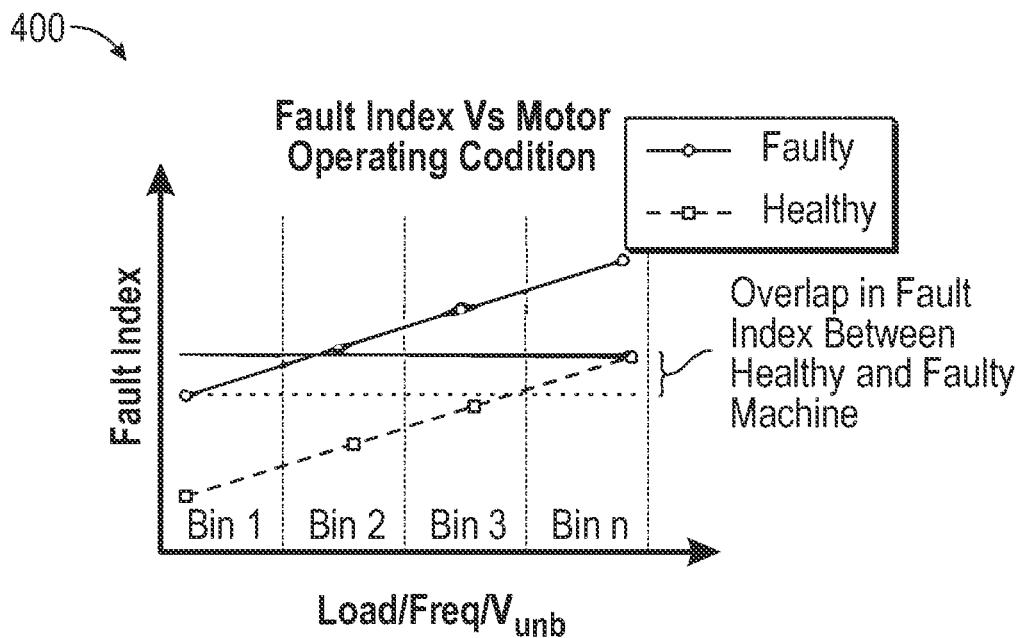
FIGS. 4A-4B depict examples of a binning process, in accordance with one or more example embodiments of the disclosure.
Figure 4B:
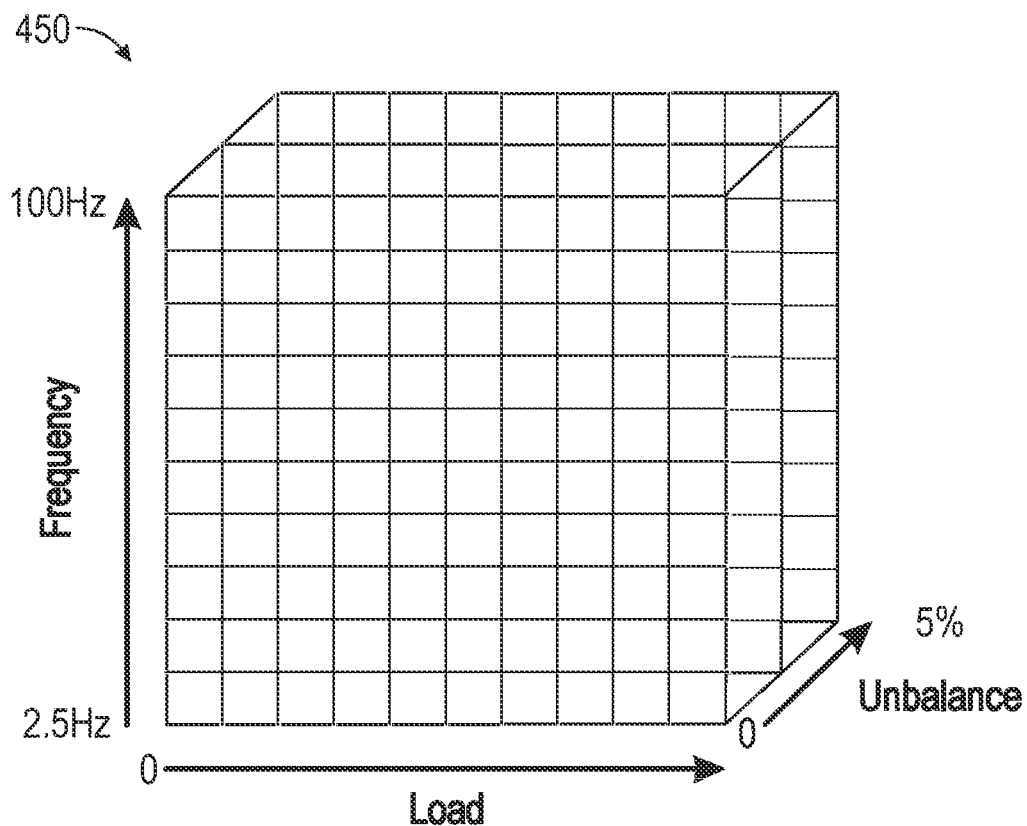

In some embodiments, as described above, the monitoring and diagnostics described herein may also involve the use of fault index baselining to monitor for different types of failure modes in power system assets. That is, a baseline of fault indices corresponding to certain failure modes for an asset may be established, and these baselines may be used to identify a deviation above the threshold as a fault. A threshold may be calculated for each failure mode based on the statistics of data collected in the baseline and additional preconfigured conditions which are tunable. Once baselining is complete with minimum number of points being captured, the system may be configured to compare a moving average of fault index points with the calculated thresholds and a fault alarm may be generated when a fault index exceeds a determined threshold. For example, a baseline may include one or more determined fault indices (it should be noted that reference may be made herein to "a fault index," but multiple fault indices may be determined for a failure mode to establish a baseline as well) and the threshold may be based on a mean, standard deviation or any other statistical measure of the baseline fault indices. Then, if during real-time operation of the machine, a mean of the data being captured is above the mean of the baseline fault indices by the threshold amount for a particular type of failure mode, then it may be determined that a fault indicative of that particular type of failure mode may be taking place. For example, if indices corresponding to the fault frequency of a bearing fault are determined to be above the baseline threshold, then it may be determined that a bearing fault may have taken place. This example is further illustrated in FIG. 2 described below. Furthermore, various types of baselines may be stablished. For example, baselines may be established for individual assets of a power system. On a more granular level, baselines may also be established for individual types of failure modes for power system assets. As depicted in FIGS. 4A-4B described below, baselines may also be established for different data bins corresponding to different asset operating conditions. Finally, baselines may also be established for clusters of assets as well.

In some embodiments, the IEDs (and/or the assets associated with the IEDs) in the power system may be divided into clusters (or groupings) of assets for purposes of failure analysis. A cluster may be a group of IEDs that may be formed during the baselining period. A cluster may be established based on various factors, such as the type of asset associated with the IED, nameplate information of the asset, condition assessment during baseline based on fault index, manufacture year range, load type/application and other user-configurable factors. These clusters may be used to create fault baselines for a group of IEDs rather than individual IEDs, and the cluster may be monitored to determine if individual IEDs deviate from the performance of the other IEDs in the cluster. This may allow for a more optimal monitoring system as variations may be more quickly identified when such clusters are used rather than establishing and monitoring baselines for each individual IED in the power system. Based on the motor health condition observed with respect to a cluster baseline and its continuous health assessment during monitoring performed by the remote device, the remote device may access and communicate with the gateway device to retrieve COMTRADE-type files from specific IEDs at a given interval/rate associated with that particular that cluster (for example, data may be obtained more frequently for degrading motors and vice versa). The remote device may fine tune fault threshold logic adaptively based on the combination of both cluster baseline and monitoring data derived statistics considering multiple fault frequency indices evolution specific to each cluster type. For example, fault threshold logic may compute mean and standard deviations of baseline data during a baseline mode and mean and standard deviation of a last N data samples continuously while monitoring data. A fault indication decision may involve logic comparing the mean of monitored data with both the mean of baseline data and standard deviation of the baseline and monitored data (e.g., mean (monitoring)>mean (baseline), mean (monitoring)>n*standard deviation (baseline and/or monitoring)). At the same time, a fault indication decision to a user may be delayed if the rate of change of monitoring data is found to be less than predefined value.

In some embodiments, the data obtained from the IEDs may also be pre-processed using a data binning process. Data binning may involve creating discrete groupings covering different power system asset operating condition ranges, where each bin may include its own associated one or more fault indices (an example of this is depicted in FIG. 4A). An operating condition may refer to load variations, input power variations, input supply voltage unbalance, fundamental frequency of input voltage/current, power factor, etc. These conditions may vary to meet operating requirements of the system or due to variations at the input energy source to the asset. Motor input power may increase as the load experienced by the driven equipment changes, for example, valve position may change in pump or compressor type loads, movement of steel plate in to rollers in steel mill, etc. Supply voltage unbalance can change depending on the grid condition. Fundamental frequency change happens in variable frequency drive (VFD) fed machine to change the operating speed of the machine to meet specific load requirements. An operating condition range may include a range of frequencies, load variations, and/or voltage supply unbalance values, for example, but may also include any other operating conditions of a power system asset. For example, a given asset may not operate under the same operating conditions continuously throughout its lifetime, or different assets in the power system may operate under differing operating conditions. Performing binning of the data may be beneficial because there may exist variation in the fault indices as the power system asset operating conditions change, which can result in an overlap between a "healthy" fault index for one operating condition and a "faulty" fault index in another operating condition. This may lead to non-detection of a fault (false negative), for example, if baselining is performed in a first operating condition and a fault happens in a second operating condition. In this scenario, the fault may not be detected because the healthy fault index for the second operating condition may be the same as the faulty fault index for the first operating condition. Likewise, this may also lead to false detection of a fault when a fault may not actually exist (false positive). This may occur if baselining is performed in the second operating condition and the power system asset operation condition shifts to the first operating condition. In this scenario, a false increase in a fault index may be detected and a false alarm may be triggered. Binning may serve to mitigate these potential problems by creating individual fault index values for smaller ranges of operating conditions.

In some instances, the binning process may also involve the creating of multidimensional bins (for example, as depicted in FIG. 4B). The benefits of multidimensional binning may be similar to those explained above. The fault index may experience a change in addition to a real fault due to a variation in any of the operating conditions. However, if binning is performed with respect to only load, the benefits described above may only apply to load variation but not with frequency variation (as one specific example). Performing the multidimensional binning helps to achieve the above-described benefits of binning for variations in any of the operating condition, instead of just a single operating condition.

Illustrative System

Turning to the figures, FIG. 1 illustrates an example system 100, in accordance with one or more embodiments of this disclosure. The system 100 may depict an example of a system used for monitoring and diagnosing power system assets as described herein. In some embodiments, the system may include one or more assets 102, one or more IEDs 104, one or more gateway devices 106, and/or one or more remote devices 108, which may be associated with a dashboard 110.

In some embodiments, the one or more assets 102 may refer to any component included within an example power system. For example, an asset 102 may include a motor, a generator, a pump, a turbine, a power generation component, a compressor, an engine, a gearbox, or any component or machine in a power plant. The one or more IEDs 104 may refer to devices with embedded logic that may be associated with the one or more assets 102. For example, an IED 104 may be in the form of a relay. The one or more IEDs 104 may be used to capture data from the one or more assets 102 and provide such data to the gateway device 106 (as well as any other device). For example, the one or more IEDs 104 may capture voltage and/or current waveforms from the one or more assets 104 to provide to the gateway device 106, as well as any other types of data that may be used to perform fault monitoring and diagnosis. In some cases, each individual asset 102 in a power system may be associated with an individual IED 104, however, in some cases, multiple assets 102 may share a single IED or multiple IEDs 104 may be used to capture data from a single asset 102 as well.

In some embodiments, a gateway device 106 may be a device that may be used as an intermediary between the one or more IEDs 104 and the remote device 108. In some instances, the gateway device may be a data concentrator. The gateway device 106 may trigger individual IEDs 104 or groups of IEDs 104 (for example, clusters of IEDs 104 as described above) to provide data pertaining to any assets 102 that the IEDs 104 are associated with. The gateway device 106 may then provide this data to the remote device 108 for further analysis. In some cases, the gateway device 106 may also perform data quality checks and other analyses as well. The gateway device 106 may be used to perform any of the methods and/or operations described herein (for example, any methods and/or operations described with respect to FIG. 5). The gateway device 106 may include at least one or more processors 116, memory 118, data storage 120, and one or more analysis modules 122. The data storage 120 may be used to store any data described herein. In some instances, any of the information stored in the data storage may also be stored in memory 118 as well. The one or more power control modules 122 may be configured to perform any of the operations described herein, such as any operations associated with monitoring and diagnosis of fault conditions in power system (for example, methods and/or operations described with respect to FIG. 5, as well as any other methods and/or operations described herein). Additionally, any of the one or more processors 116, memory 118, data storage 120 and or power control modules 122 may be described in more detail with respect to FIG. 6 as well.

In some embodiments, the one or more remote devices 108 may be devices used to perform analysis of the data produced by the IEDs 104 associated with the assets 102 in the power system. For example, the one or more remote devices 108 may include remote servers hosting cloud-based services. In some cases, the one or more remote devices 108 may be responsible for performing all of the data quality checks and analyses described herein and the gateway device 106 may simply serve as an intermediary for forwarding the data from the IEDs 104 to the one or more remote devices 108. However, in some cases, the gateway device 106, as mentioned above, may also perform some of the data quality checks and data analysis as well to reduce the processing requirements of the one or more remote devices 108. The one or more remote devices 108 may include similar elements as the gateway device 106. For example, the one or more remote devices 108 may include at least one or more processors 116, memory 118, data storage 120, and one or more analysis modules 122. That is, the one or more remote devices 108 may also be configured to perform any of the operations described herein, such as methods and/or operations described with respect to FIG. 5, for example. Additionally, any of the one or more processors 116, memory 118, data storage 120 and or power control modules 122 may be described in more detail with respect to FIG. 6 as well. Furthermore, the one or more remote devices 108 may also be associated with a dashboard 110, which may be in the form of a user interface that a user 116 that is accessible to a user 116. In some instances, the dashboard 112 may allow the user to interact with the one or more devices 108, such as viewing any data being processed by the one or more remote devices 108 and viewing any analyses performed by the one or more remote devices 108 (including, for example, an alert that may be generated to indicate to the user 116 that a fault has occurred). The dashboard 110 may also allow the user 116 to configure certain parameters associated with the one or more remote devices 108, such as data being presented to the user 116, triggering times for capturing data from various IEDs 104, among any other types of parameters associated with the operations described herein.

Figure 2:
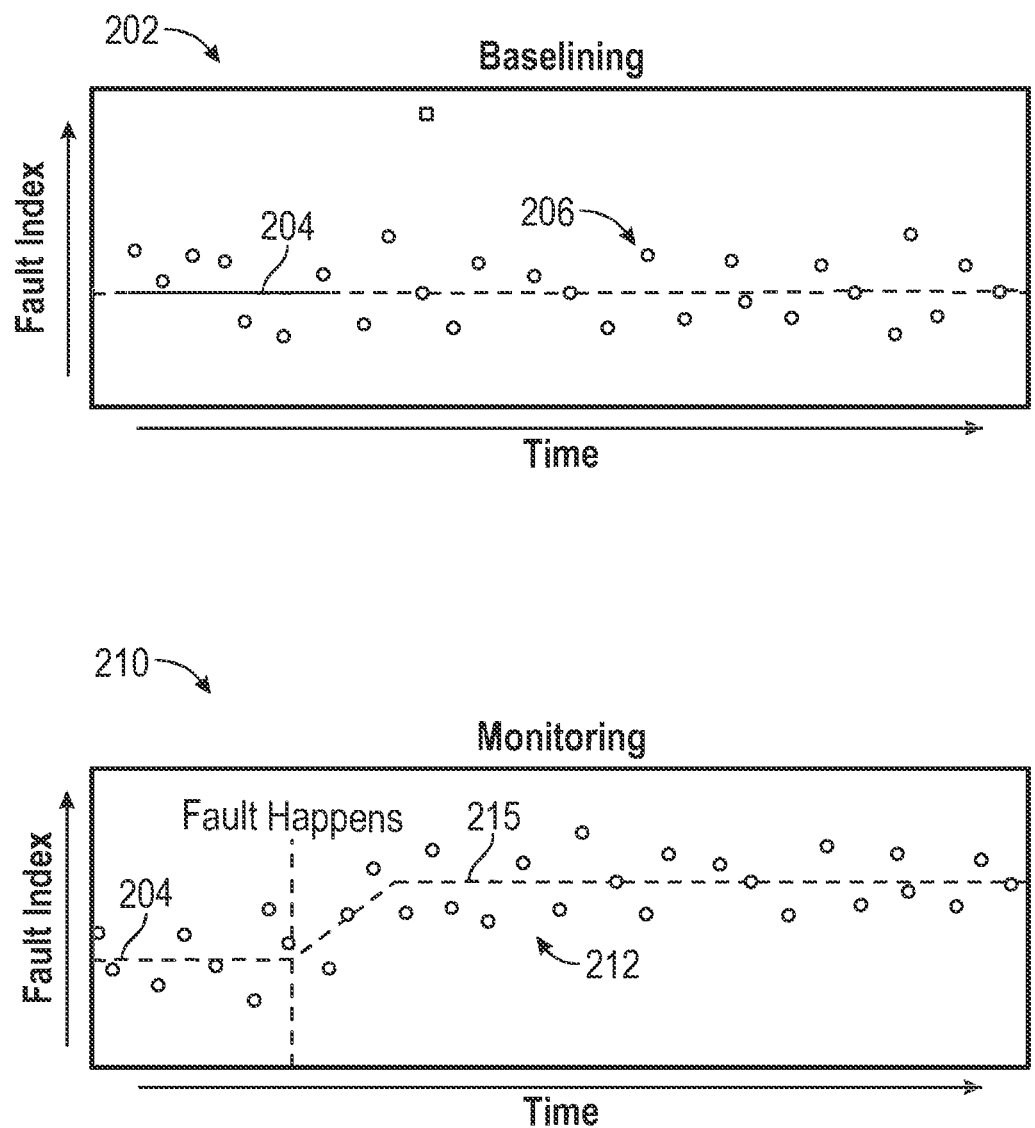
FIG. 2 depicts an example method of baselining, in accordance with one or more example embodiments of the disclosure.

FIG. 2 depicts an example of baselining, in accordance with one or more example embodiments of the disclosure. FIG. 2 may include a first plot 202 including a baseline 204 established by one or more fault indices 206 for a type of failure mode determined using the systems and methods described herein. FIG. 2 may also depict a second plot 210 indicating a fault condition taking place. The second plot 210 may show one or more data points 212 that may be captured during real-time operation of the machine. During a time period, it is depicted that a mean value 215 of the one or more data points 212 is greater than the baseline 204 by a particular amount. Based on this, it may be determined that a fault of the particular type of failure mode has taken place. As described above, a number of different baselines may be established and monitored by the systems and methods described here. For example, baselines may be established for individual failure modes, individual assets, clusters of assets, among various other baselines. Each of these baselines may be monitored individually and an alarm, or alert, to a user may be provided if any of the baselines are surpassed (for example, if the asset is experiencing a fault of a particular fault mode).

Figure 3:
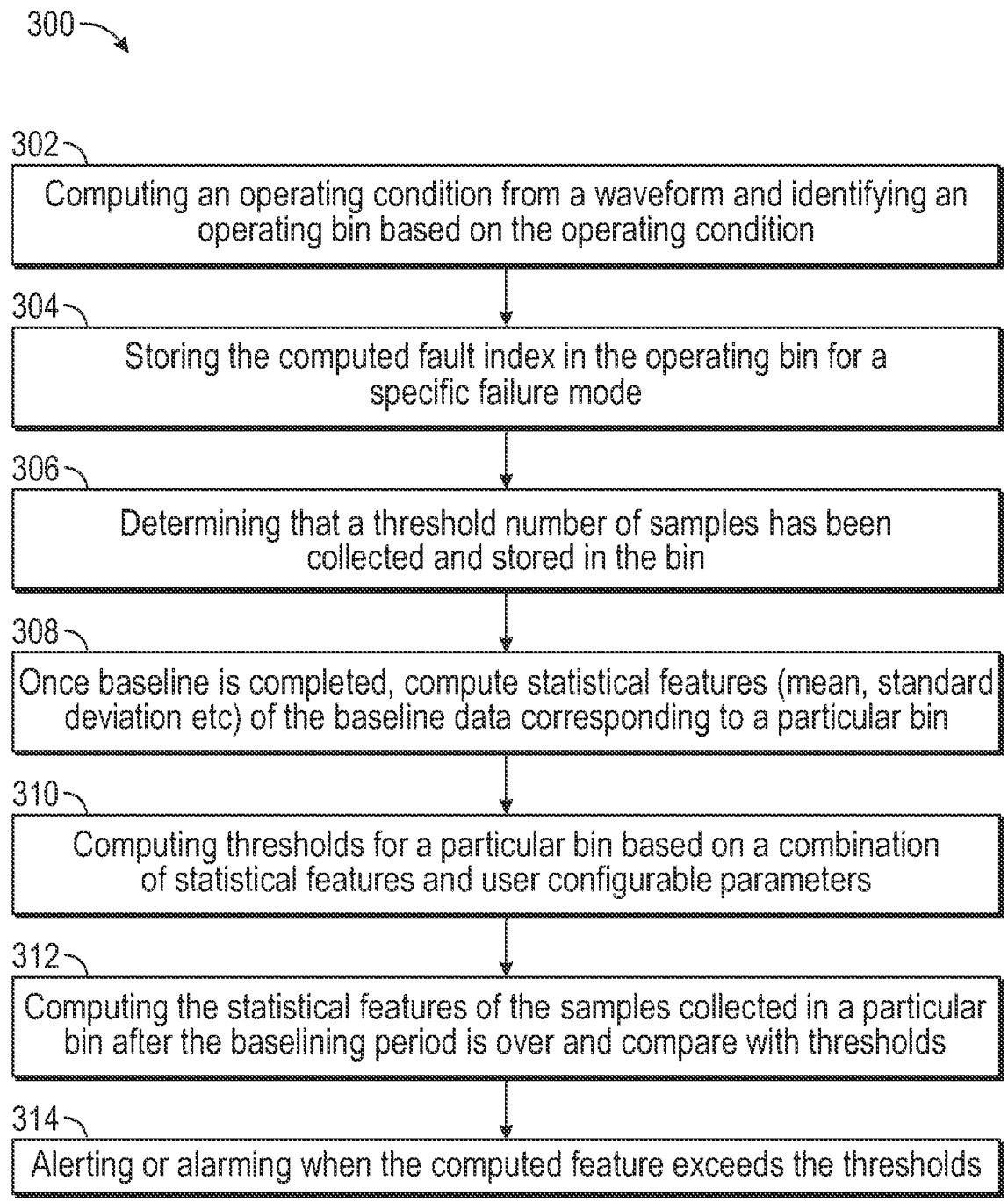
FIG. 3 depicts an example method flowchart, in accordance with one or more example embodiments of the disclosure.

FIG. 3 depicts an example flowchart 300, in accordance with one or more example embodiments of the disclosure. More particularly, FIG. 3 may depict a flowchart 300 that may be used to perform baselining and alarm generation in the case of a detected fault in an asset in the power system. The flowchart 300 may begin with operation 302, which may involve computing an operating condition from a waveform and identifying an operating bin based on the operating condition (e.g., load, voltage unbalance, frequency, etc.). The flowchart 300 may then proceed to operation 304, which may involve storing a computed fault index in an appropriate bin for a specific failure mode. The flowchart 300 may then proceed to operation 306, which may involve determining that a threshold number of samples has been collected and stored in the bin. That is, operation 306 may allow sufficient time for a statistically significant number of samples to be obtained to fill the bins and form a baseline of fault indices for a particular bin. The flowchart 300 may then proceed to operation 308, which may involve computing statistical features (e.g., mean, standard deviation, etc.) for the baseline data corresponding to the particular bin. This may be performed once the baselining is completed. The flowchart 300 may then proceed to operation 310, which may involve computing thresholds for the particular bin based on a combination of statistical features and user configurable parameters. The flowchart 300 may then proceed to operation 312, which may involve computing statistical features of samples collected in the particular bin after the baselining period is over. These values may then be compared with thresholds. The flowchart 300 may then proceed to operation 314, which may involve triggering an alert or an alarm when a computed feature exceeds a threshold value.

An operating bin based on, for example, an operating load, voltage unbalance or frequency is identified from the operating condition of the collected waveforms of voltages or currents. For a specific failure, the computed fault index is stored in the appropriate bin. The baselining period should be long enough to collect a statistically significant number of samples in each operating bin. It is expected that the fault indices for the baseline in a specific bin are clustered close to each other and any significant deviation from the cluster needs to be eliminated, considering it as an outlier. The statistical features based on, for example, mean and standard deviation are computed for the baseline data for a particular bin. The thresholds for a particular bin are then computed based on a combination of statistical features and user configurable parameters, for instance, a first threshold to alert based on the 3 sigma deviation from baseline, and/or second threshold to alarm based on a 5 sigma deviation from the baseline.

FIGS. 4A-4B depict examples of a binning process, in accordance with one or more example embodiments of the disclosure. In some embodiments, the data obtained from the IEDs may be pre-processed using a data binning process. Data binning may involve creating discrete groupings covering different power system asset operating condition ranges, where each bin may include its own fault index value. An operating condition may refer to load variations, input power variations, input supply voltage unbalance, fundamental frequency of input voltage/current, power factor, etc. These conditions may vary to meet operating requirements of the system or due to variations at the input energy source to the asset. Motor input power may increase as the load experienced by the driven equipment changes, for example, valve position may change in pump or compressor type loads, movement of steel plate in to rollers in steel mill, etc. Supply voltage unbalance can change depending on the grid condition. Fundamental frequency change happens in variable frequency drive (VFD) fed machine to change the operating speed of the machine to meet specific load requirements. An operating condition range may include a range of frequencies, load variations, and/or voltage supply unbalance values, for example, but may also include any other operating conditions of a power system asset. An example of this may be depicted in FIG. 4A. FIG. 4A shows a plot 400 that includes one or more bins (for example, a first bin 401, a second bin 402, a third bin 403, and a fourth bin 404, as well as any other number of bins). Each bin may be associated with a range of operating condition values (for example, bin 1 may be associated with a first operating condition value range 406). Additionally, each of the bins may include its own individual fault index (for example, the first bin 401 may include a first fault index 408 that is indicative of a faulty asset operating under the operating condition range covered by the first bin and the second bin 402 may include a second fault index 410 that is indicative of a faulty asset operating in the operating range covered by the second bin 402. In some instances, the example first fault index 408 and second fault index 410 may represent threshold values. If fault indices obtained for any assets in the power system are at or above these values, then the asset may be experiencing a fault condition. The same may apply to any other fault indices for any of the other bins (for example, fault index 412 for the third bin 403 and fault index 414 for the fourth bin 404). Performing binning of the data may be beneficial because there may exist variation in the fault indices as the power system asset operating conditions change, which can result in an overlap between a "healthy" fault index for one operating condition and a fault index indicative of a faulty asset in another operating condition. This may lead to non-detection of a fault (false negative), for example, if baselining is performed in a first operating condition and a fault happens in a second operating condition. In this scenario, the fault may not be detected because the healthy fault index for the second operating condition may be the same as the faulty fault index for the first operating condition. This may be visualized by comparing the first bin 401 and the fourth bin 404. If baselining is performed for the operating condition range 406 covered by the first bin 401, then a first fault index 408 may be established. If the operating conditions change to an operating condition range associated with what would be the fourth bin 404, then a fault index 415 that is actually indicative of a non-faulty asset in this particular operating condition may be detected as a faulty asset because the fault index 415 may match or surpass the value of the fault index 408 associated with the faulty condition for the asset in the operating range 406. This may occur if no binning is performed because the baseline fault index may be established in under one operating condition, but this baseline fault index may not necessarily apply to assets operating under other operating conditions. Thus, binning serves to mitigate this potential issue by establishing different fault indices for different operating conditions by separating the operating conditions into discrete groups or bins. Likewise, this may also lead to false detection of a fault when a fault may not actually exist (false positive). This may occur if baselining is performed in the second operating condition and the power system asset operation condition shifts to the first operating condition. In this scenario, a false increase in a fault index may be detected and a false alarm may be triggered. Binning may serve to mitigate these potential problems by creating individual fault index values for smaller ranges of operating conditions.

In some instances, the binning process may also involve the creating of multidimensional bins (for example, as depicted in FIG. 4B). The benefits of multidimensional binning may be similar to those explained above. The fault index may experience a change in addition to a real fault due to a variation in any of the operating conditions. However, if binning is performed with respect to only load, the benefits described above may only apply to load variation but not with frequency variation (as one specific example). Performing the multidimensional binning helps to achieve the above-described benefits of binning for variations in any of the operating condition, instead of just a single operating condition.

Illustrative Methods

Figure 5:
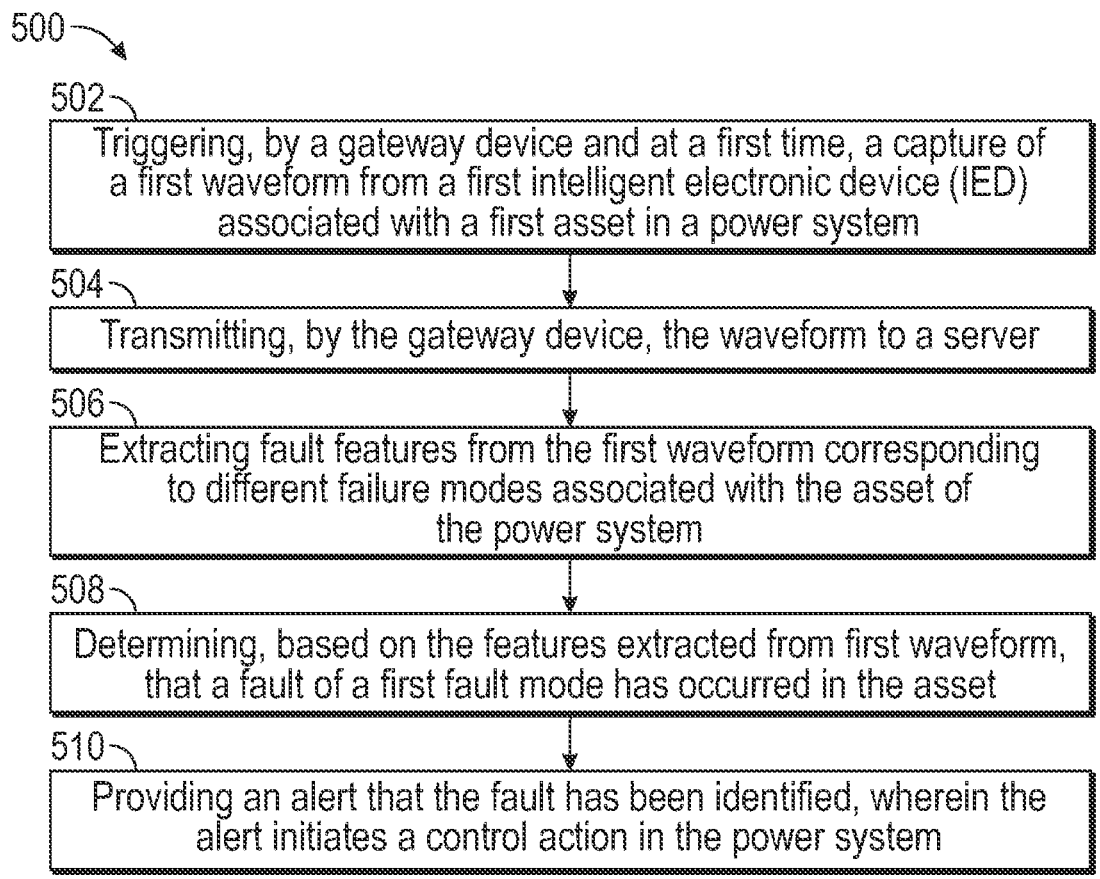
FIG. 5 depicts an example method, in accordance with one or more example embodiments of the disclosure.

FIG. 5 is an example method 500 according to an example embodiment of the disclosure. At block 502 of the method 500 in FIG. 5, the method may include triggering, by a gateway device and at a first time, a capture of a first waveform from a first intelligent electronic device (IED) associated with a first asset in a power system. Block 504 of the method 500 may include transmitting, by the gateway device, the waveform to a remote device. Block 506 of the method 500 may include extracting fault features from the first waveform corresponding to different failure modes associated with the asset of the power system. Block 508 of the method 500 may include determining, based on the features extracted from first waveform, that a fault of a first fault mode has occurred in the asset. Block 510 of the method 500 may include providing an alert that the fault has been identified, wherein the alert initiates or facilitates a control action in the power system. In some instances, the first waveform may be a COMTRADE-type file.

In some embodiments, the first waveform may be associated with a first failure mode of the first asset, and triggering the capture of the first waveform may be based on a determination that a sampling frequency or a data length of the first IED for the first failure mode satisfies a first threshold sampling frequency or first threshold data length for the first failure mode.

In some embodiments, the method 500 may also include determining that a sampling frequency or a data length of the first IED for a second failure mode fails to satisfy a second first threshold sampling frequency or a second threshold data length for the second failure mode, wherein second threshold sampling frequency or a second threshold data length may be different than a first threshold sampling frequency or a first threshold data length associated with a first failure mode. The method 500 may also include blocking, based on the determination that the sampling frequency or the data length associated with the first IED for the second failure mode fails to satisfy the second threshold sampling frequency or the second threshold data length of the second failure mode, feature extraction and fault detections associated with the second failure mode for the first IED.

In some embodiments, the method 500 may also include creating a first cluster of assets including the first asset and a second asset. The method 500 may also include triggering, by the gateway device, a capture of a second waveform from a second IED associated with the second asset in the power system. The method 500 may also include sending, by the gateway device and to the remote device, the second waveform. The method 500 may also include establishing an operational baseline for the first cluster of assets based on the first waveform and the second waveform.

In some embodiments, the method 500 may also include triggering, by the gateway device, and at a second time, a capture of a second waveform from the first IED. The method 500 may also include determining that a fault feature of the second waveform deviates from the operational baseline for the first cluster of assets. The method 500 may also include determining, based on the determination that a fault feature of the second waveform deviates from the operational baseline for the first cluster of assets, that a fault of a first fault mode has occurred in a first asset associated with the first IED.

In some embodiments, the method 500 may also include triggering, by the gateway device and at a second time corresponding to a start-up of the first IED, a capture of a second waveform from the first IED. The method 500 may also include establishing a second operational baseline for the cluster of assets based on the capture of the second waveform.

In some embodiments, establishing the operational baseline for the first cluster further comprises establishing an operational baseline for a first data bin comprising a first range of operating conditions for the first cluster. The method 500 may also further comprise establishing a second operational baseline for the first cluster for a second data bin comprising a second range of operating conditions for the first cluster.

In some embodiments, triggering the capture of the first waveform from the first IED may be based on a first triggering rate. The method 500 may also include reducing, subsequent to triggering the capture of the first waveform from the first IED, a triggering rate for capturing subsequent waveforms to a second triggering rate. The method 500 may also include increasing, based on the determination that the first fault mode has occurred in the asset, the triggering rate to a third triggering rate that is higher than the second triggering rate.

In some embodiments, the method 500 may also include performing, by the gateway device, at least one of a first data quality check or a second data quality check, wherein transmitting the capture of the waveform to the remote device is further based on the waveform passing the first data quality check or the second data quality check, wherein the first data quality check may involve comparing low frequency data to one or more threshold values, the low frequency data including at least one of: root mean square (RMS) voltage, RMS current, or frequency, wherein the second data quality check may involve a phase-locked loop (PLL) and envelope extraction of voltage and current signals in the waveform to make a transient stability determination.

In some embodiments, a control action can be starting, controlling, or shutting down a motor, a generator, a pump, a turbine, a power generation component, or any component or machine in a power plant. In some embodiments, the method 500 may include initiating or facilitating a control action when the fault has been identified, wherein the control action can be starting, controlling, or shutting down a motor, a generator, a pump, a turbine, a power generation component, or any component or machine in a power plant.

The operations described and depicted in the illustrative process flow of FIG. 5 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIG. 5 may be performed.

Illustrative Computing System and Device

Figure 6:
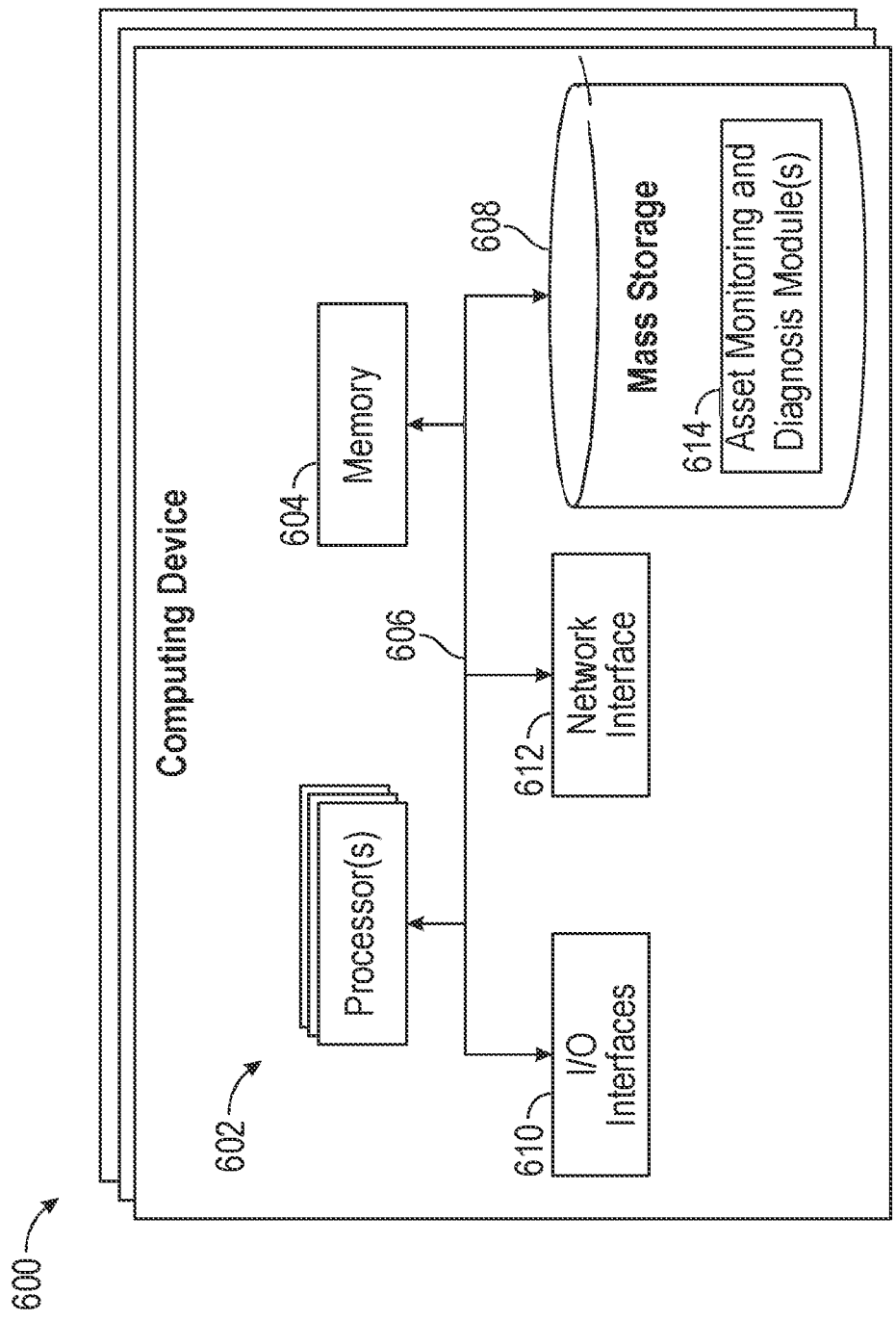
FIG. 6 depicts a schematic illustration of an example computing system and device architecture, in accordance with one or more example embodiments of the disclosure.

FIG. 6 illustrates an example computing system and device 600, in accordance with one or more embodiments of this disclosure. The computing device 600 may be representative of any number of elements described herein, such the gateway device 106, one or more remote devices 108, or any other element described herein. The computing device 600 may include one or more processors 602 that execute instructions that are stored in one or more memory devices (referred to as memory 604). The instructions can be, for instance, instructions for implementing functionality described as being carried out by one or more modules and systems disclosed above or instructions for implementing one or more of the methods disclosed above. The one or more processors 602 can be embodied in, for example, a CPU, multiple CPUs, a GPU, multiple GPUs, a TPU, multiple TPUs, a multi-core processor, a combination thereof, and the like. In some embodiments, the one or more processors 602 can be arranged in a single processing device. In other embodiments, the one or more processors 602 can be distributed across two or more processing devices (e.g., multiple CPUs; multiple GPUs; a combination thereof; or the like). A processor can be implemented as a combination of processing circuitry or computing processing units (such as CPUs, GPUs, or a combination of both). Therefore, for the sake of illustration, a processor can refer to a single-core processor; a single processor with software multithread execution capability; a multi-core processor; a multi-core processor with software multithread execution capability; a multi-core processor with hardware multithread technology; a parallel processing (or computing) platform; and parallel computing platforms with distributed shared memory. Additionally, or as another example, a processor can refer to an integrated circuit (IC), an ASIC, a digital signal processor (DSP), an FPGA, a PLC, a complex programmable logic device (CPLD), a discrete gate or transistor logic, discrete hardware components, or any combination thereof designed or otherwise configured (e.g., manufactured) to perform the functions described herein.

The one or more processors 602 can access the memory 604 by means of a communication architecture 606 (e.g., a system bus). The communication architecture 606 may be suitable for the particular arrangement (localized or distributed) and types of the one or more processors 602. In some embodiments, the communication architecture 606 can include one or many bus architectures, such as a memory bus or a memory controller; a peripheral bus; an accelerated graphics port; a processor or local bus; a combination thereof, or the like. As an illustration, such architectures can include an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, a Peripheral Component Interconnect (PCI) bus, a PCI-Express bus, a Personal Computer Memory Card International Association (PCMCIA) bus, a Universal Serial Bus (USB), and/or the like.

Memory components or memory devices disclosed herein can be embodied in either volatile memory or non-volatile memory or can include both volatile and non-volatile memory. In addition, the memory components or memory devices can be removable or non-removable, and/or internal or external to a computing device or component. Examples of various types of non-transitory storage media can include hard-disc drives, zip drives, CD-ROMs, digital versatile disks (DVDs) or other optical storage, magnetic cassettes, magnetic tape, magnetic disk storage or other magnetic storage devices, flash memory cards or other types of memory cards, cartridges, or any other non-transitory media suitable to retain the desired information and which can be accessed by a computing device.

As an illustration, non-volatile memory can include read-only memory (ROM), programmable ROM (PROM), electrically programmable ROM (EPROM), electrically erasable programmable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The disclosed memory devices or memories of the operational or computational environments described herein are intended to include one or more of these and/or any other suitable types of memory. In addition to storing executable instructions, the memory 604 also can retain data.

Each computing device 600 also can include mass storage 608 that is accessible by the one or more processors 602 by means of the communication architecture 606. The mass storage 608 can include machine-accessible instructions (e.g., computer-readable instructions and/or computer-executable instructions). In some embodiments, the machine-accessible instructions may be encoded in the mass storage 608 and can be arranged in components that can be built (e.g., linked and compiled) and retained in computer-executable form in the mass storage 608 or in one or more other machine-accessible non-transitory storage media included in the computing device 600. Such components can embody, or can constitute, one or many of the various modules disclosed herein. Such modules are illustrated as asset monitoring and diagnostic modules 614. Additionally, protocols such as Modbus, DNP, IEC 60870, IEC 61850, Profibus, Fieldbus, etc. may be used in conjunction with the systems and methods described herein.

Execution of the asset monitoring and diagnostic modules 614, individually or in combination, by the one more processors 602, can cause the computing device 600 to perform any of the operations described herein (for example, the operations described with respect to FIG. 5, as well as any other operations).

Each computing device 600 also can include one or more input/output interface devices 610 (referred to as I/O interface 610) that can permit or otherwise facilitate external devices to communicate with the computing device 600. For instance, the I/O interface 610 may be used to receive and send data and/or instructions from and to an external computing device.

The computing device 600 also includes one or more network interface devices 612 (referred to as network interface(s) 612) that can permit or otherwise facilitate functionally coupling the computing device 600 with one or more external devices. Functionally coupling the computing device 600 to an external device can include establishing a wireline connection or a wireless connection between the computing device 600 and the external device. The network interface devices 612 can include one or many antennas and a communication processing device that can permit wireless communication between the computing device 600 and another external device. For example, between a vehicle and a smart infrastructure system, between two smart infrastructure systems, etc. Such a communication processing device can process data according to defined protocols of one or several radio technologies. The radio technologies can include, for example, 3G, Long Term Evolution (LTE), LTE-Advanced, 5G, IEEE 802.11, IEEE 802.16, Bluetooth, ZigBee, near-field communication (NFC), and the like. The communication processing device can also process data according to other protocols as well, such as vehicle-to-infrastructure (V2I) communications, vehicle-to-vehicle (V2V) communications, and the like. The network interface(s) 612 may also be used to facilitate peer-to-peer ad-hoc network connections as described herein.

As used in this application, the terms "environment," "system," "unit," "module," "architecture," "interface," "component," and the like refer to a computer-related entity or an entity related to an operational apparatus with one or more defined functionalities. The terms "environment," "system," "module," "component," "architecture," "interface," and "unit," can be utilized interchangeably and can be generically referred to functional elements. Such entities may be either hardware, a combination of hardware and software, software, or software in execution. As an example, a module can be embodied in a process running on a processor, a processor, an object, an executable portion of software, a thread of execution, a program, and/or a computing device. As another example, both a software application executing on a computing device and the computing device can embody a module. As yet another example, one or more modules may reside within a process and/or thread of execution. A module may be localized on one computing device or distributed between two or more computing devices. As is disclosed herein, a module can execute from various computer-readable non-transitory storage media having various data structures stored thereon. Modules can communicate via local and/or remote processes in accordance, for example, with a signal (either analogic or digital) having one or more data packets (e.g., data from one component interacting with another component in a local system, distributed system, and/or across a network such as a wide area network with other systems via the signal).

As yet another example, a module can be embodied in or can include an apparatus with a defined functionality provided by mechanical parts operated by electric or electronic circuitry that is controlled by a software application or firmware application executed by a processor. Such a processor can be internal or external to the apparatus and can execute at least part of the software or firmware application. Still, in another example, a module can be embodied in or can include an apparatus that provides defined functionality through electronic components without mechanical parts. The electronic components can include a processor to execute software or firmware that permits or otherwise facilitates, at least in part, the functionality of the electronic components.

In some embodiments, modules can communicate via local and/or remote processes in accordance, for example, with a signal (either analog or digital) having one or more data packets (e.g., data from one component interacting with another component in a local system, distributed system, and/or across a network such as a wide area network with other systems via the signal). In addition, or in other embodiments, modules can communicate or otherwise be coupled via thermal, mechanical, electrical, and/or electro-mechanical coupling mechanisms (such as conduits, connectors, combinations thereof, or the like). An interface can include input/output (I/O) components as well as associated processors, applications, and/or other programming components.

Further, in the present specification and annexed drawings, terms such as "store," "storage," "data store," "data storage," "memory," "repository," and substantially any other information storage component relevant to the operation and functionality of a component of the disclosure, refer to memory components, entities embodied in one or several memory devices, or components forming a memory device. It is noted that the memory components or memory devices described herein embody or include non-transitory computer storage media that can be readable or otherwise accessible by a computing device. Such media can be implemented in any methods or technology for storage of information, such as machine-accessible instructions (e.g., computer-readable instructions), information structures, program modules, or other information objects.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

What has been described herein in the present specification and annexed drawings includes examples of systems, devices, techniques, and computer program products that, individually and in combination, permit the automated provision of an update for a vehicle profile package. It is, of course, not possible to describe every conceivable combination of components and/or methods for purposes of describing the various elements of the disclosure, but it can be recognized that many further combinations and permutations of the disclosed elements are possible. Accordingly, it may be apparent that various modifications can be made to the disclosure without departing from the scope thereof. In addition, or as an alternative, other embodiments of the disclosure may be apparent from consideration of the specification and annexed drawings, and practice of the disclosure as presented herein. It is intended that the examples put forth in the specification and annexed drawings be considered, in all respects, as illustrative and not limiting. Although specific terms are employed herein, they are used in a generic and descriptive sense only and not for purposes of limitation.

That which is claimed is:

1. A method comprising:
   triggering, by a device, a capture of a first waveform of a first asset in a power system;
   creating, by the device, a first cluster of a same type of assets including the first asset in the power system and a second asset in the power system;
   triggering, by the device, a capture of a second waveform of the second asset in the power system;
   establishing, by the device, a first operational baseline for assets in the first cluster of assets, wherein the first operational baseline is based on the first waveform of the first asset and the second waveform of the second asset;
   triggering, by a device, a capture of a third waveform of a third asset in the power system;
   creating, by the device, a second cluster of a same type of assets including the third asset in the power system and a fourth asset in the power system;
   triggering, by the device, a capture of a fourth waveform of the fourth asset in the power system;
   establishing, by the device, a second operational baseline for assets in the second cluster of assets, wherein the second operational baseline is based on the third waveform of the third asset and the fourth waveform of the fourth asset;
   comparing, by the device, first features of the first waveform to the first operational baseline;
   comparing, by the device, second features of the third waveform to the second operational baseline;
   determining, by the device, based on the comparison of the first features to the first operational baseline, that a first fault has occurred in the first asset;
   determining, by the device, based on the comparison of the second features to the second operational baseline, that a second fault has not occurred in the third asset; and
   providing, by the device, an alert that the first fault has been identified, wherein the alert initiates or facilitates a control action in the power system.

2. The method of claim 1, wherein the first operational baseline is for a first bin of operating conditions for the first cluster of assets, and wherein the second operational baseline is for a second bin of operation conditions for the second cluster of assets, the method further comprising:
   establishing a third operational baseline for a third bin of operating conditions for the first cluster of assets, wherein the third operational baseline is different than the first operational baseline; and
   establishing a fourth operational baseline for a fourth bin of operating conditions for the second cluster of assets, wherein the fourth operational baseline is different than the second operational baseline.

3. The method of claim 2, wherein at least one of the first bin, the second bin, the third bin, or the fourth bin is a multi-dimensional bin.

4. The method of claim 1, wherein the first operational baseline is for a first failure mode, the method further comprising:
   establishing a third operational baseline for the first cluster of assets, wherein the third operational baseline is for a second failure mode different than the first failure mode.

5. The method of claim 1, further comprising:
   comparing third features of the second waveform to the first operational baseline; and
   determining, based on the comparison of the third features to the first operational baseline, whether a third fault has occurred in the second asset.

6. The method of claim 1, further comprising:
   receiving the first waveform, the second waveform, the third waveform, and the fourth waveform from an access point.

7. A system comprising:
   a device comprising at least one first processor coupled to at least one memory storing first computer-executable instructions, that when executed by the at least one processor, cause the at least one processor to:
   trigger a capture of a first waveform of a first asset in a power system;
   create a first cluster of a same type of assets including the first asset in the power system and a second asset in the power system;
   trigger a capture of a second waveform of the second asset in the power system;
   establish a first operational baseline for assets in the first cluster of assets, wherein the first operational baseline is based on the first waveform of the first asset and the second waveform of the second asset;
   trigger a capture of a third waveform of a third asset in the power system;
   create a second cluster of a same type of assets including the third asset in the power system and a fourth asset in the power system;
   trigger a capture of a fourth waveform of the fourth asset in the power system;
   establish a second operational baseline for assets in the second cluster of assets, wherein the second operational baseline is based on the third waveform of the third asset and the fourth waveform of the fourth asset;
   compare first features of the first waveform to the first operational baseline;
   compare second features of the third waveform to the second operational baseline;
   determine, based on the comparison of the first features to the first operational baseline, that a first fault has occurred in the first asset; and
   determine, based on the comparison of the second features to the second operational baseline, that a second fault has not occurred in the third asset; and
   provide an alert that the first fault has been identified, wherein the alert initiates or facilitates a control action in the power system.

8. The system of claim 7, wherein the first operational baseline is for a first bin of operating conditions for the first cluster of assets, and wherein the second operational baseline is for a second bin of operation conditions for the second cluster of assets, and wherein execution of the computer-executable instructions further cause the at least one processor to:

establish a third operational baseline for a third bin of operating conditions for the first cluster of assets, wherein the third operational baseline is different than the first operational baseline; and establish a fourth operational baseline for a fourth bin of operating conditions for the second cluster of assets, wherein the fourth operational baseline is different than the second operational baseline.

9. The system of claim 8, wherein at least one of the first bin, the second bin, the third bin, or the fourth bin is a multi-dimensional bin.

10. The system of claim 7, wherein the first operational baseline is for a first failure mode, and wherein execution of the computer-executable instructions further cause the at least one processor to:

establish a third operational baseline for the first cluster of assets, wherein the third operational baseline is for a second failure mode different than the first failure mode.

11. The system of claim 7, wherein execution of the computer-executable instructions further cause the at least one processor to:

compare third features of the second waveform to the first operational baseline; and determine, based on the comparison of the third features to the first operational baseline, whether a third fault has occurred in the second asset.

12. The system of claim 7, wherein execution of the computer-executable instructions further cause the at least one processor to:

receive the first waveform, the second waveform, the third waveform, and the fourth waveform from an access point.

13. A non-transitory computer-readable medium comprising instructions that when executed by at least one processor cause the at least one processor to:

trigger a capture of a first waveform of a first asset in a power system;

create a first cluster of a same type of assets including the first asset in the power system and a second asset in the power system;

trigger a capture of a second waveform of the second asset in the power system;

establish a first operational baseline for assets in the first cluster of assets, wherein the first operational baseline is based on the first waveform of the first asset and the second waveform of the second asset;

trigger a capture of a third waveform of a third asset in the power system;

create a second cluster of a same type of assets including the third asset in the power system and a fourth asset in the power system;

trigger a capture of a fourth waveform of the fourth asset in the power system;

establish a second operational baseline for assets in the second cluster of assets, wherein the second operational baseline is based on the third waveform of the third asset and the fourth waveform of the fourth asset;

compare first features of the first waveform to the first operational baseline;

compare second features of the third waveform to the second operational baseline;

determine, based on the comparison of the first features to the first operational baseline, that a first fault has occurred in the first asset;

determine, based on the comparison of the second features to the second operational baseline, that a second fault has not occurred in the third asset; and provide an alert that the first fault has been identified, wherein the alert initiates or facilitates a control action in the power system.

14. The non-transitory computer-readable medium of claim 13, wherein the first operational baseline is for a first bin of operating conditions for the first cluster of assets, wherein the second operational baseline is for a second bin of operation conditions for the second cluster of assets, and wherein execution of the instructions further causes the at least one processor to:

establish a third operational baseline for a third bin of operating conditions for the first cluster of assets, wherein the third operational baseline is different than the first operational baseline; and establish a fourth operational baseline for a fourth bin of operating conditions for the second cluster of assets, wherein the fourth operational baseline is different than the second operational baseline.

15. The non-transitory computer-readable medium of claim 14, wherein at least one of the first bin, the second bin, the third bin, or the fourth bin is a multi-dimensional bin.

16. The non-transitory computer-readable medium of claim 13, wherein the first operational baseline is for a first failure mode, and wherein execution of the instructions further causes the at least one processor to:

establish a third operational baseline for the first cluster of assets, wherein the third operational baseline is for a second failure mode different than the first failure mode.

17. The non-transitory computer-readable medium of claim 13, wherein execution of the instructions further causes the at least one processor to:

compare third features of the second waveform to the first operational baseline; and determine, based on the comparison of the third features to the first operational baseline, whether a third fault has occurred in the second asset.

* * * * *